US008527922B1

(12) United States Patent
Baumgartner et al.

(10) Patent No.: US 8,527,922 B1
(45) Date of Patent: Sep. 3, 2013

(54) METHOD AND SYSTEM FOR OPTIMAL COUNTEREXAMPLE-GUIDED PROOF-BASED ABSTRACTION

(75) Inventors: Jason R. Baumgartner, Austin, TX (US); Michael L. Case, Pflugerville, TX (US); Robert L. Kanzelman, Rochester, MN (US); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/455,789

(22) Filed: Apr. 25, 2012
(Under 37 CFR 1.47)

(51) Int. Cl.
*G06F 17/50* (2006.01)
*G06F 7/60* (2006.01)

(52) U.S. Cl.
USPC .................. 716/106; 716/103; 703/2; 703/14

(58) Field of Classification Search
None
See application file for complete search history.

(56) References Cited

U.S. PATENT DOCUMENTS

| 7,356,792 B2 * | 4/2008 | Baumgartner et al. ....... 716/106 |
| 7,406,405 B2 * | 7/2008 | McMillan et al. ................ 703/2 |
| 7,742,907 B2 * | 6/2010 | Gupta et al. .................... 703/14 |
| 7,743,353 B2 * | 6/2010 | Baumgartner et al. ....... 716/106 |
| 7,917,884 B2 * | 3/2011 | Baumgartner et al. ....... 716/136 |
| 2004/0123254 A1 * | 6/2004 | Geist et al. ......................... 716/4 |
| 2004/0153308 A1 | 8/2004 | McMillan et al. |
| 2008/0092093 A1 * | 4/2008 | Balakrishnan et al. ........... 716/4 |

OTHER PUBLICATIONS

Henzinger et al., Lazy Abstraction, Proceedings of the 29th ACM SIGPLAN-SIGACT symposium on Principles of Programming Languages, pp. 58-70, Jan. 2002.*
Marques-Silva et al., GRASP—A New Search Algorithm for Satisfiability, Proceedings of the 1996 IEEE/ACM International COnference on Computer-Aided Design, pp. 220-227, Nov. 1996.*
IBM, Linear Elimination of Redundant Variables of Abstraction Refinement, IP.com Prior Art Database, Technical Disclosure, IP.com No. IPCOM000180736D, Mar. 16, 2009.
Ashar et al., From Hardware Verification to Software Verification Re-use and Re-learn, Haifa Verification Conference, Oct. 25, 2007, Princeton, USA.
Clarke et al., Counterexample-Guided Abstraction Refinement, CAV 2000, LNCS 1855, pp. 154-169, 2000.
Baumgartner et al., Optimal Constraint-Preserving Netlist Simplification, IEEE, 2008.

* cited by examiner

*Primary Examiner* — A. M. Thompson
(74) *Attorney, Agent, or Firm* — Yudell Isidore Ng Russell PLLC

(57) ABSTRACT

A computer-implemented method includes receiving an input containing a candidate netlist, a target, and a number, K, of cycles of interest, where K represents a number of cycles required to be analyzed for the proof-based abstraction. In response to receiving the inputs, a computing device builds an inductively unrolled netlist, utilizing random, symbolic initial values, for K cycles and provides the unrolled netlist with a first initial value constraint to a satisfiability (SAT) solver, with the first initial value constraint empty. The method includes determining whether a result of the SAT solver is satisfiable, and in response to the result not being satisfiable, performing an abstraction on the netlist and outputting the abstraction. However, in response to the result being satisfiable, the method includes performing one of: (a) outputting a valid counterexample of the original netlist; and (b) lazily adding initial value constraints to avoid spurious counterexamples.

23 Claims, 8 Drawing Sheets

METHOD AND SYSTEM FOR OPTIMAL COUNTEREXAMPLE-GUIDED PROOF-BASED ABSTRACTION

BACKGROUND

1. Technical Field

The present disclosure generally relates to verification techniques for integrated circuit logic design and in particular to techniques for performing counterexample-guided proof-based abstractions.

2. Description of the Related Art

Formal verification techniques are powerful tools for the construction of correct logic designs. These verification techniques have the power to expose even the most probabilistically uncommon scenario that may result in a functional design failure, and ultimately, the techniques have the power to prove that the design is correct, i.e., that no failing scenario exists. Unfortunately, formal verification techniques require computational resources, and these computational resources are exponential with respect to the size of the design under test, requiring, in a worst case scenario, the analysis of every "reachable state" of a given design. Various techniques have been proposed to enable application of formal verification techniques to large designs, and most of these techniques rely on the technique of Abstraction.

BRIEF SUMMARY

Disclosed are a method, a computing device and a computer program product that implement techniques for performing optimal counterexample-guided proof-based abstraction on a candidate netlist. The computer-implemented method includes the functions of: receiving an input containing a candidate netlist (N1), a target (T1), and a number, K, of cycles of interest, wherein K is an integer number that represents a number of cycles that are required to be analyzed for the proof-based abstraction; in response to receiving the inputs, a processor of the computing device building an inductively unrolled netlist, utilizing random, symbolic initial values, for K cycles; providing the unrolled netlist with a first initial value constraint to a satisfiability (SAT) solver where the first initial value constraint is empty; receiving a result of the SAT solver; determining whether the result of the SAT solver is satisfiable; in response to the result of the SAT solver not being satisfiable, performing an abstraction on the netlist and outputting the abstraction; and in response to the result of the SAT solver being satisfiable, performing one of: (a) outputting a valid counterexample of the original netlist; and (b) lazily adding initial value constraints to avoid spurious counterexamples.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments is to be read in conjunction with the accompanying drawings, wherein.

DETAILED DESCRIPTION

Figure 1:
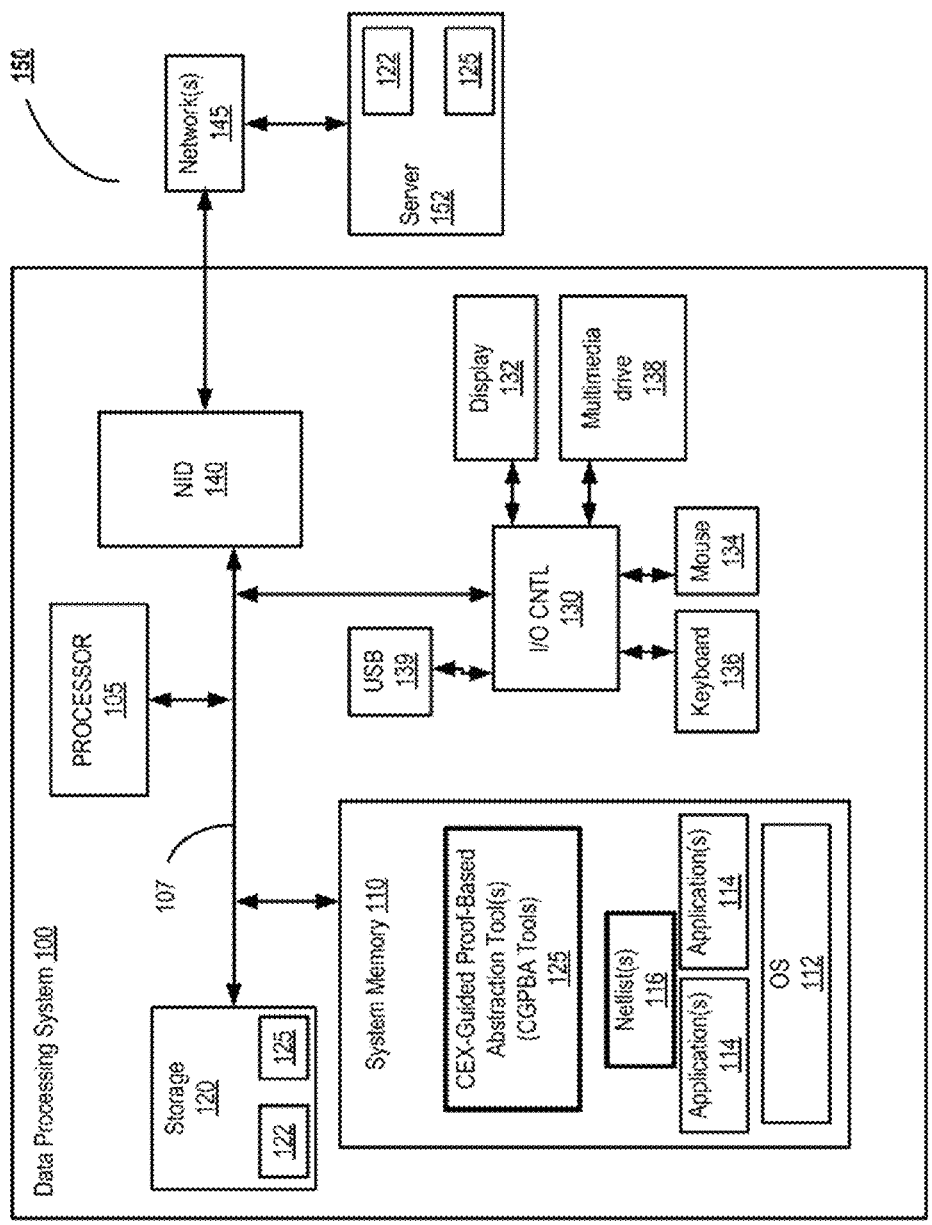
FIG. 1 provides a block diagram representation of an example data processing system within which the various embodiments of the disclosure can advantageously be implemented, according to one embodiment.

The illustrative embodiments provide a method, a computing device and a computer program product that implement techniques for performing optimal counterexample-guided proof-based abstraction on a candidate netlist. Specifically, the computer-implemented method includes the functions of: receiving an input containing a candidate netlist (N1), a target (T1), and a number, K, of cycles of interest, wherein K is an integer number that represents a number of cycles that are required to be analyzed for the proof-based abstraction; in response to receiving the inputs, a processor of the computing device building an inductively unrolled netlist, utilizing random, symbolic initial values, for K cycles; providing the unrolled netlist with a first initial value constraint to a satisfiability (SAT) solver where the first initial value constraint is empty; receiving a result of the SAT solver; determining whether the result of the SAT solver is satisfiable; in response to the result of the SAT solver not being satisfiable, performing an abstraction on the netlist and outputting the abstraction; and in response to the result of the SAT solver being satisfiable, performing one of: (a) outputting a valid counterexample of the original netlist; and (b) lazily adding initial value constraints to avoid spurious counterexamples.

In the following detailed description of exemplary embodiments of the disclosure, specific exemplary embodiments in which the disclosure may be practiced are described in sufficient detail to enable those skilled in the art to practice the disclosure, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof.

It is understood that the use of specific component, device and/or parameter names (such as those of the executing utility/logic described herein) are for example only and not meant to imply any limitations on the disclosure. The disclosure may thus be implemented with different nomenclature/terminology utilized to describe the components/devices/parameters herein, without limitation. Each term utilized herein is to be given its broadest interpretation given the context in which that terms is utilized. The below paragraphs thus introduces certain terminology and concepts that is utilized within the descriptions of the various embodiments of the disclosure.

Throughout the description of the various embodiments of the disclosure, the presented logic representation format of the logic design being evaluated is defined in terms of a netlist. As provided herein, a netlist contains a directed graph with vertices representing gates, and edges representing interconnections between those gates. The gates have associated functions, such as constants, primary inputs, combinational logic, such as AND gates, simple sequential elements, and memory arrays. Within the following descriptions, primary inputs shall be interchangeably referred to as RANDOM gates, and simple sequential elements shall be interchangeably referred to as registers. Registers have two associated components: the register's next-state functions and the register's initial-value functions. Both components are represented as other gates in the directed graph. Semantically, for a given register, the value appearing at the register's initial-value gate at time "0", which represents the "initialization" or "reset" time, will be applied as the value of the register itself. The value appearing at the register's next-state function gate at time "i" will be applied to the register itself at time "i+1". A "state" is a valuation to the registers of a netlist. A state which may be witnessed within 0 or more transitions from the initial states is referred to as a "reachable state".

Within the netlist, certain gates are labeled as "targets". In the described embodiments, targets correlate to the properties for which verification is desired, and the goal of the verification process is to find a way to drive a logic "1" to a target node, or to prove that no such assertion of the target is possible. If a target may be asserted, a counterexample trace is often desired, comprising a sequence of valuations to the gates of a netlist. This sequence of valuations represents a method to transition the netlist from an initial state to a state asserting a selected target. A "trace" is a sequence of Boolean valuations to the gates of a netlist over time, beginning at time 0. A trace illustrating the assertion of a target is sometimes referred to as a "counterexample trace".

Certain aspects of the embodiments provide enhancements of a technique referred to as abstraction. As presented herein, abstraction means, in effect, removing information about a netlist design, which information is not relevant to a property that is being verified. Although there are many different types of abstraction available, one simple approach that works in verifying large designs is to throw away parts of the design that are not deemed relevant to the property. This technique is known as localization abstraction. With localization abstraction irrelevant parts of the design are eliminated by "cutpointing" those parts—or replacing the parts with primary inputs. Localization abstraction can be done in either of the following two ways: (a) a counterexample guided abstraction refinement; and (b) proof-based abstraction. With counterexample guided abstraction refinement, the idea is to start with a minimal initial localization and apply formal verification techniques to prove the abstraction. If a counterexample is found, the counterexample is analyzed to check whether the counterexample is spurious, i.e., not applicable in the original design. If the counterexample is spurious, an analysis of the counterexample is performed to find a set of gates that can be added to the localization to grow the localization and avoid the spurious CEX. This process is repeated until either the property has been verified or until a concrete counterexample is produced. With proof-based abstraction, a SAT solver is utilized to generate a proof that there is no counterexample of K-steps. This proof can be referred to as an "unsatisfiable core", which is a subset of logic adequate to guarantee the proof. The set of gates that participate in the proof becomes the abstraction.

The advantage of the proof-based abstraction approach is that all counterexamples of length K are ruled out at once, where the counterexample-guided abstraction approach can require several refinement iterations to accomplish this. However, the main disadvantage of proof-based abstraction is that proving that there are no counterexamples of length K is much more costly than refuting a single abstract counterexample. This disadvantage can be exacerbated by the fact that one cannot apply any simplification techniques to simplify and reduce the SAT problem that is analyzed by the SAT solver to generate the proof. This is because such simplifications can make it virtually impossible to identify which gates in the original design participate in the proof. Due to this drawback of the inability to simplify, conventional proof-based abstraction also tends to generate bigger abstractions than necessary.

One of the simplest and most useful simplification techniques when creating the K-step unrolled design for analysis by the SAT solver is the in-lining of constant initial values of state elements and the subsequent constant propagation to simplify the unrolled design. However, even this simple technique cannot be used during proof-based abstraction as the in-lining of constant initial values can interfere with generating the abstraction from the proof. To enable a sound abstraction, in-lining of constant initial values is avoided and a separate initial value constraint is provided to the SAT solver. However providing a separate initial value constraint can result in extra complexity for the SAT-solver, as the SAT solver has to deal with this extra constraint, which could get very big and difficult to analyze for huge designs.

As previously introduced, embodiments of the present disclosure provides a novel counter-example guided initial value abstraction scheme or technique to improve proof-based abstraction. Unlike traditional approaches which eagerly apply all initial values of state elements, one aspect of the technique involves providing a lazy application of initial values of state elements, which application of initial values is guided by spurious counterexamples generated as part of the Satisfiability (SAT)-solving being performed to generate a proof. Implementation of the technique not only enables proof-based abstraction to generate a much smaller abstraction, but the technique also significantly reduces the time taken for proof-based abstraction. Specifically, the lazy application of initial value constraints enables the SAT solver to skip dealing with complex initial value constraints. These complex initial value constraints represent one of the main reasons that a large amount of resources are needed for conventional proof-based abstraction. Thus, by enabling the SAT solver to skip these complex initial value constraints, the technique enables significant reductions in the time to complete proof based abstractions using the tools described herein. Additionally, by abstracting away initial values of latches, the technique forces the SAT solver to concentrate on the core circuit logic that is responsible for the property to be verified. Consequently, the SAT solver is able to generate tighter and smaller abstractions. Also, by lazily applying initial values constraints, the SAT solver is made to avoid inclusion of unnecessary state elements in the unsatisfiable core and thereby generate smaller abstractions.

With reference now to the figures, and beginning with FIG. 1, there is depicted a block diagram representation of an example data processing system (DPS), within which the various computer-implemented methods of the disclosure along with the logic design of one or more target netlists can advantageously be implemented. DPS 100 sits within a DPS environment 150 that supports networking and/or other remote functionality of DPS 100. DPS 100 is configured to execute one or more analysis tools to analyze a logic design for correct operation, including specific tools and/or engines that enable the various aspects of the described embodiments. DPS 100 can take various forms and can be represented as a workstations, laptop computer systems, notebook computer systems, desktop computer systems and/or clusters thereof. While not preferable due to processor size constraints and the high computational requirements of the computer-implemented algorithms presented in the various described embodiments, DPS 100 can also be a smaller processing system, such as a smart phone, tablet PC, and the like, without limitation. DPS 100 includes a processor 105 or central processing unit (CPU), which may include one or more processor cores for executing program code. Processor 105 is coupled to a system memory 110 via a system interconnect or system bus 107. Also connected to processor 105 via system bus 107 are storage 120, input/output (I/O) adapter/controller 130, and network interface device (NID) 140. Coupled to I/O adapter/controller 130 are one or more output devices, of which display 132 is provided as an example, and one or more input devices, of which mouse 134 and keyboard 136 are presented as examples. In one embodiment, storage 120 maintains a copy of one or more netlists 122 that can be evaluated using the techniques described herein. Storage 120 can also maintain a copy of counterexample-guided proof-based abstraction (CGPBA) tool 125, which represents a combination of the various algorithms and/or executable modules that can be loaded into system memory 110 prior to execution by processor 105 to implement the different functions presented herein.

Within the network environment 150, DPS 100 is communicatively connected to one or more wired or wireless networks 145, such as the Internet, to a server 152. Server 152 can be, for example, a tool server that facilitates download to DPS 100 of various analysis tools (e.g., verification, simulation, hardware acceleration, or synthesis tools), which shall also be collectively referred to as CGPBA tool 125. Server 152 can also be a netlist server from which example netlist 116 can be downloaded for analysis.

Loaded within system memory 110 are various executable program modules and/or software-coded algorithms, including, for example, operating system (OS) 112 of DPS 100, application programs 114 (e.g., a word processing application, a presentation application, and a netlist generation application). As shown, these program modules also comprise an example logic design embodied as candidate netlist(s) 116, and a copy of CGPBA tool(s) 125 specific to the disclosure. In one or more embodiments, CGPBA tool(s) 125 can include, for example, verification, simulation, and/or synthesis tools. Each algorithm and/or function within CGPBA tool(s) 125 can be an independent software module that executes on processor 105 to implement a specific set of abstraction and/or verification analyses and/or functions when applied to candidate netlist 116. In one embodiment, one or both of CGPBA tool 125 and example netlist 116 can be loaded from storage 120 prior to execution by processor 105. In another embodiment, one or both of CGPBA tools 125 and example netlist 116 can be downloaded from network server 152 or obtained from an input device, such as a flash drive insertably coupled to USB 139 or Compact Disk or Digital Video Device, coupled to and/or accessible via multimedia drive 138.

Those of ordinary skill in the art will appreciate that the hardware components and basic configuration depicted in FIG. 1 may vary. The illustrative components within DPS 100 are not intended to be exhaustive, but rather are representative to highlight essential components that are utilized to implement the present disclosure. For example, other devices/components may be used in addition to or in place of the hardware depicted. The depicted example is not meant to imply architectural or other limitations with respect to the presently described embodiments and/or the general disclosure. The data processing system depicted in FIG. 1 may be, for example, an IBM eServer pSeries system, a product of International Business Machines Corporation in Armonk, N.Y., running the Advanced Interactive Executive (AIX) operating system or LINUX operating system.

Certain aspects of the disclosure involves the execution on or by processor 105 of DPS 100 of various algorithms and/or program modules provided by CGPBA) tool 125 to yield results that can be outputted via one or more output mechanism, such as display 132. These algorithms are coded as modules for execution on processor 105 to evaluate and/or analyze candidate netlist 116, and the execution by processor 105 and/or DPS 100 of these algorithms provides a computer-implemented method for performing optimal counterexample-guided proof-based abstraction on a candidate netlist, where the method includes the functions of: receiving an input containing a candidate netlist (N1), a target (T1), and a number, K, of cycles of interest, wherein K is an integer number that represents a number of cycles that are required to be analyzed for the proof-based abstraction; in response to receiving the inputs, a processor of the computing device building an inductively unrolled netlist, utilizing random, symbolic initial values, for K cycles; providing the unrolled netlist with a first initial value constraint to a satisfiability (SAT) solver where the first initial value constraint is empty; receiving a result of the SAT solver; determining whether the result of the SAT solver is satisfiable; in response to the result of the SAT solver not being satisfiable, performing an abstraction on the netlist and outputting the abstraction; and in response to the result of the SAT solver being satisfiable, performing one of: (a) outputting a valid counterexample of the original netlist; and (b) lazily adding initial value constraints to avoid spurious counterexamples.

Figure 2:
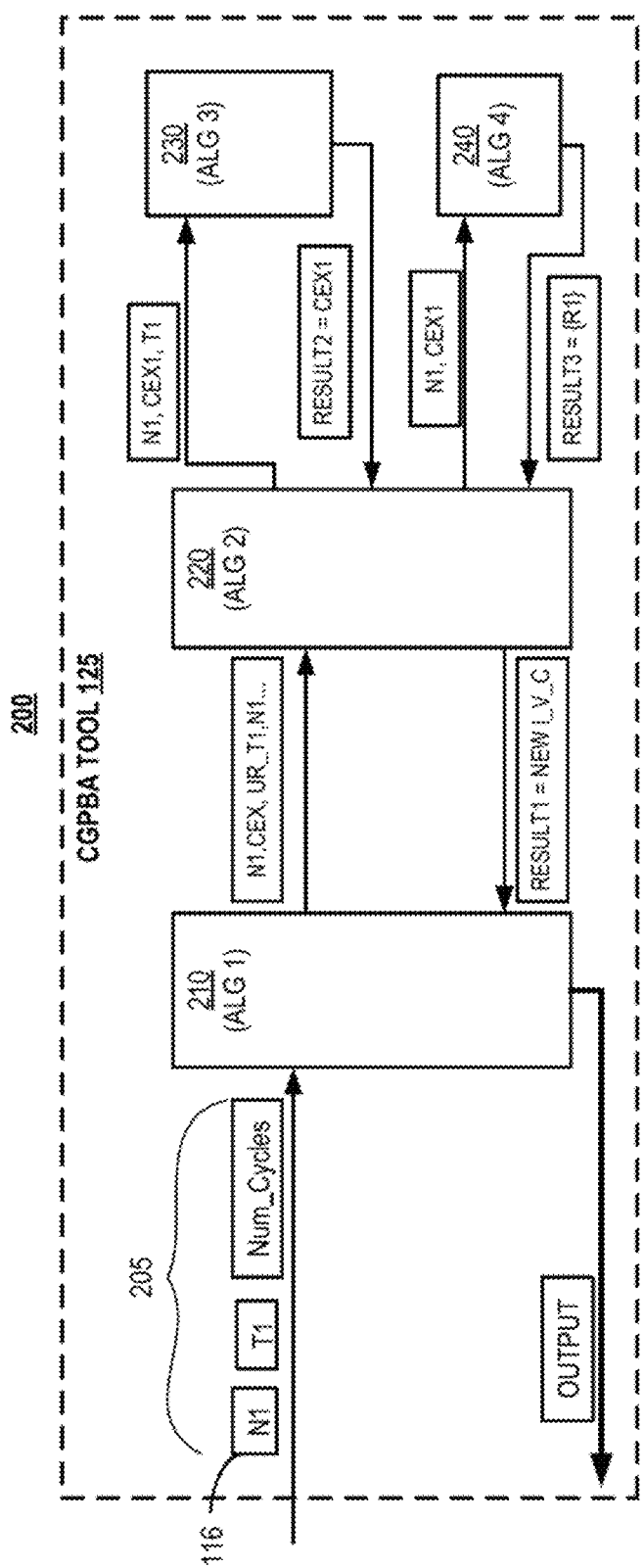
FIG. 2 illustrates a block diagram representation of functional modules of a counterexample-guided proof-based abstraction (CGPBA) tool within an multi-algorithm framework that implement the functions associated with one or more computer-implemented methods representing algorithms, according to one or more embodiments.

Referring now to FIG. 2, there is provided a sequence diagram of multi-algorithm abstraction framework 200. Multi-algorithm abstraction framework 200 includes a sequence of four computer-executable program modules, each representing one of the four algorithms described herein as generally provided within CGPBA tool 125. Illustrated within multi-algorithm abstraction framework 200 are directional links established between the various modules indicating the directional flow of processing from one algorithm to the next algorithm. Illustrated with each left-to-right directional link is a set of input parameters being passed to the next algorithm. Also, each right to left (return) link provides a Result of the algorithm on the right being passed back to the preceding algorithm. CGPBA tool 125 includes first abstraction module 210, which comprises algorithm 1, second module 220, containing algorithm 2, third module 230 and forth module 240, respectively containing algorithm 3 and algorithm 4. The functionality of each module is described herein with respect to the specific algorithms and the inputs provided to those algorithms. Each algorithm is presented in the disclosure as both pseudo-code as well as a corresponding method process illustrated by one of the flow charts.

Figure 3A:
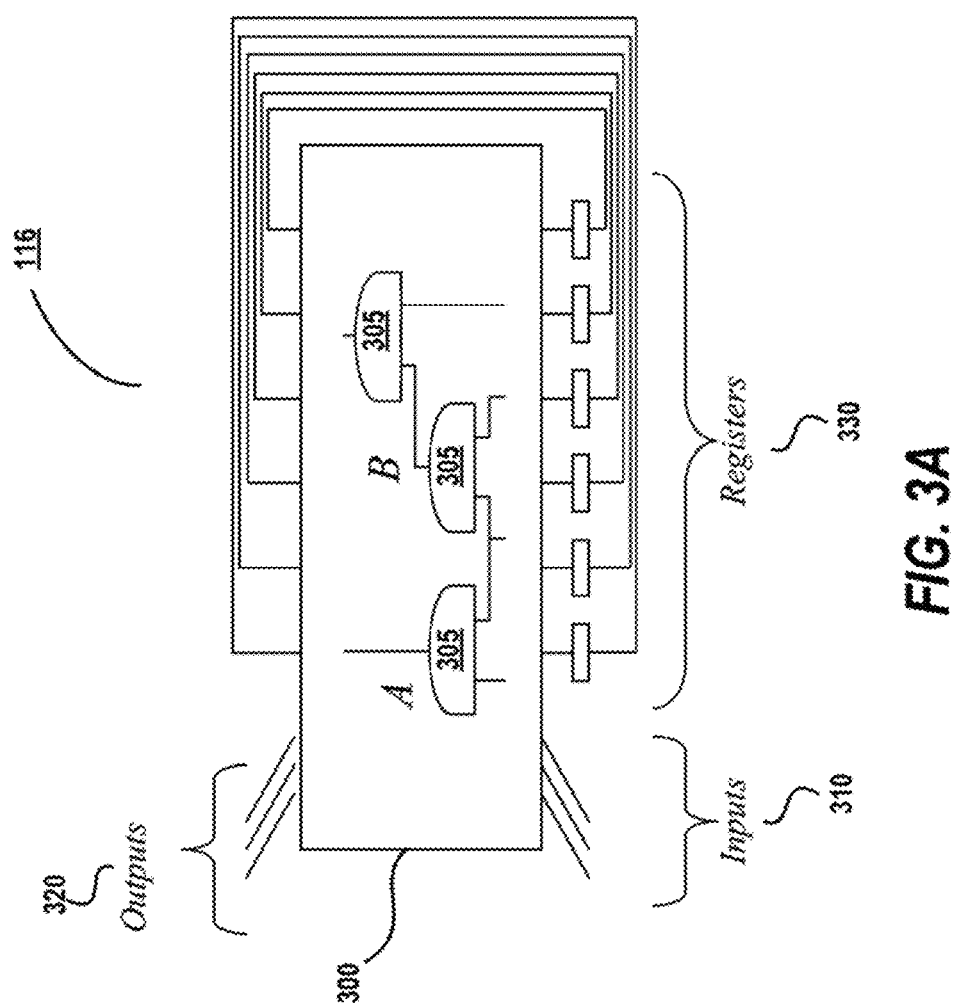
FIGS. 3A-3B respectively illustrate an example sequential netlist and the inductive unfolding of the example netlist with the use of lazy initial value constraints, according to one embodiment.
Figure 3B:
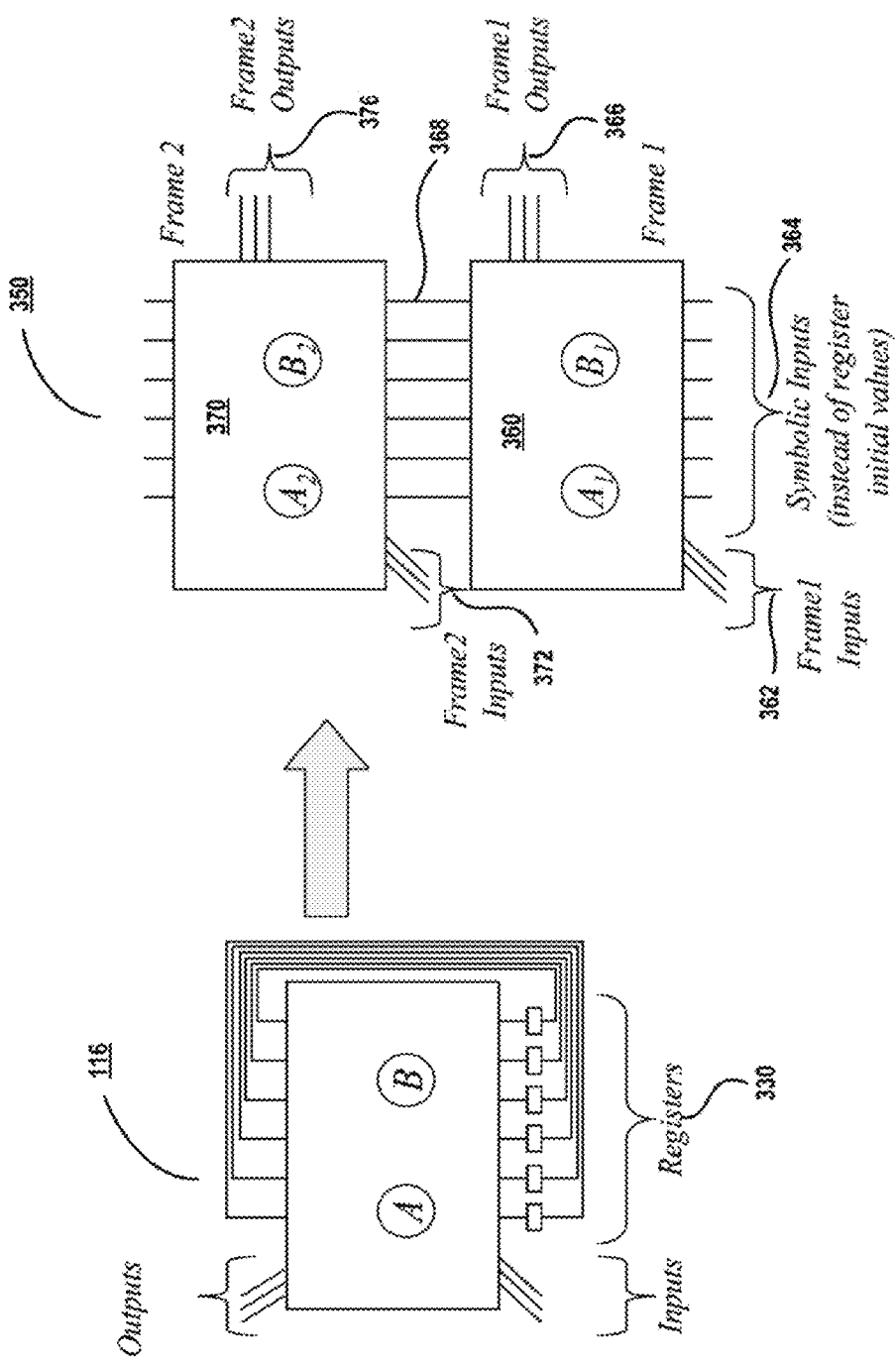

CGPBA tool 125 and specifically first module 210 receives an initial input 205 that includes candidate netlist 116 (FIG. 1) and other input parameters and generates an output of an proof-based abstraction of the candidate netlist 116 and, in one embodiment, a counterexample. Certain aspects of the processing by the CGPBA tool 125 involve the determination of initial value constraints and use of ternary values to reduce the number of evaluations required during inductive unfolding of a netlist. FIGS. 3A and 3B illustrate in diagrams one example application of inductive unfolding on an example netlist, which for continuity is illustrated as candidate netlist 116. In FIG. 3A, candidate netlist 116 is a sequential netlist. Candidate netlist 116 includes a plurality of logic components 305 which are illustrated as AND gates, with two gates specifically identified as gate A and gate B. Candidate netlist 116 also comprises a plurality of registers 330. The combinational next-state and output functions 300 of candidate netlist 116 are represented by the rectangular box to which the registers 330 are connected. Candidate netlist 116 is also shown having inputs 310 to next-state and output functions 300, which are primary inputs to the netlist 116 and registers 330. Finally, candidate netlist 116 also comprises outputs 320. With candidate netlist 116 defined as illustrated by FIG. 3A, with gates A and B identified as gates with an initial state, FIG. 3B then illustrates a two-step inductive unfolding 350 of candidate netlist 116. Each step in the unfolding is identified as a frame, with Frame1 360 being the first step and Frame2 370 being the second step. According to one aspect of the disclosure, Frame1 360 receives primary inputs 310/362 as well as symbolic and/or random inputs 364 representing the inductive initial values of registers 330. Frame1 360 generates outputs 366.

Frame2 370 receives as inputs, next-state outputs 368 from Frame1 360 and primary inputs 372 for frame2 370. Frame 2 370 can then generate frame2 output 376. During a normal unfolding, in order to check whether a target is hittable for K-cycles, the actual initial values of registers 330 are utilized instead of the symbolic inputs 364 provided at Frame1 360. According to one or more aspects of the disclosure and as described herein, references made to the initial value constraint refers to constraint over the symbolic inputs 364 shown in FIG. 3B. Specifically, the initial value constraint refers to the set of values those symbolic inputs 364 can assume. According to one or more embodiments of the disclosure, which implements a lazy initial value constraint scheme, the unfolding process is initiated with no constraint. That is, the symbolic inputs 364 are completely free and can take all $2^N$ possible values, where N represents the total number of registers 330. Based on the counterexamples obtained from this initial assignment of symbolic inputs 364, one aspect of the disclosure provides for lazily refining the constraint and essentially tightening the constraint by assigning specific values to one or more of the symbolic inputs 364. Thus, rather than allowing the symbolic inputs 364 to take all $2^N$ possible values, the method begins to restrict the symbolic inputs 364.

Figure 4:
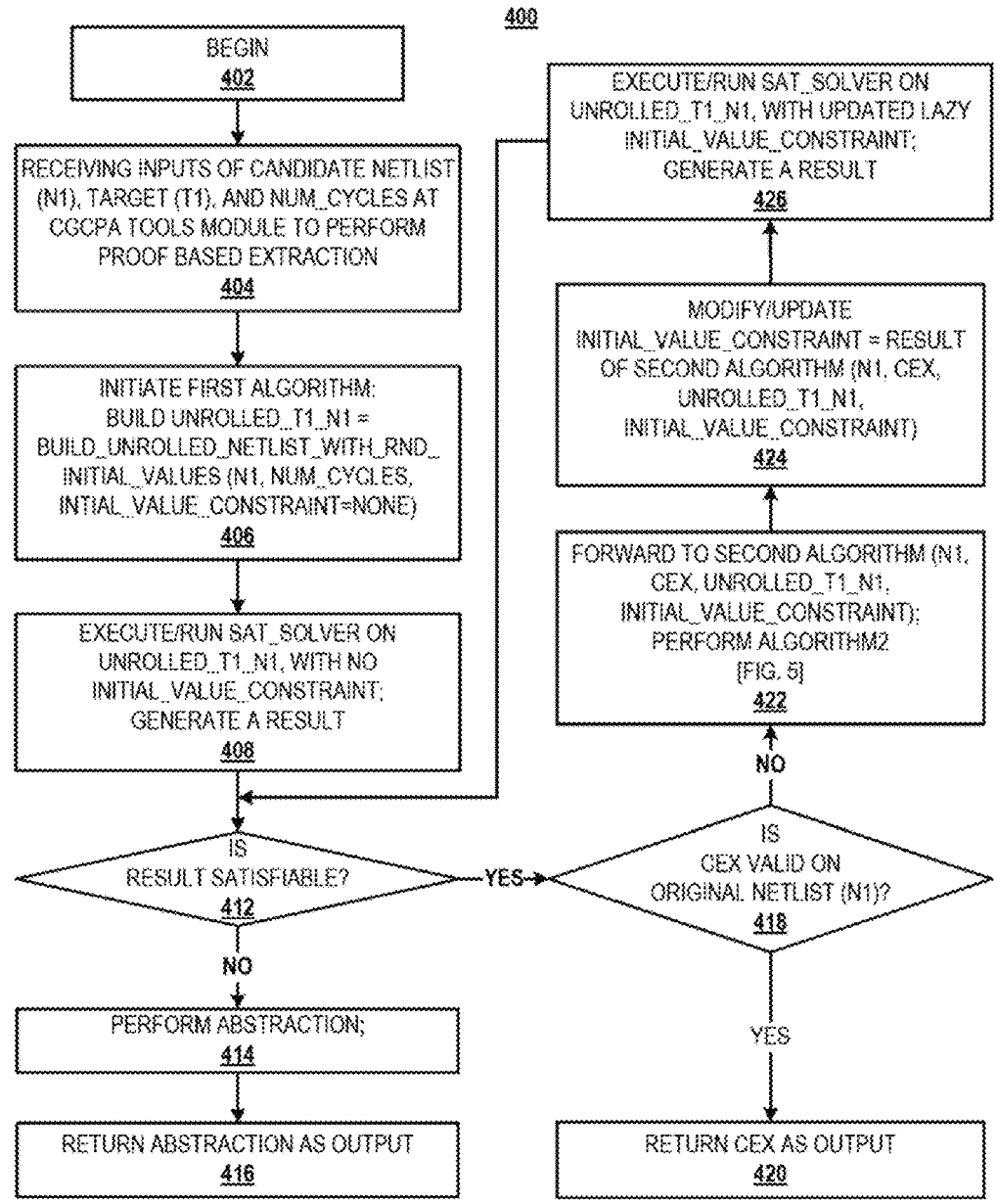
FIG. 4 is a flow chart of a first computer-implemented method for performing counterexample-guided, proof-based abstraction on a candidate netlist, according to one embodiment.

Returning to FIG. 2, the functionality of first module 210 and specifically algorithm 1 is described with reference to the below-listed pseudo code and the method illustrated by the flow chart of FIG. 4, which is now described. The method of FIG. 4 provides an enhanced proof-based abstraction that substantially reduces the time and memory requirements for generating the abstraction and also substantially reduces the size of the final abstraction. The method 400 of FIG. 4 begins at block 402 and proceeds to block 404 at which abstraction module 210 receives inputs of a candidate netlist (N1), a target (T1) and the number of cycles (NUM_CYCLES) of interest. The method 400 proceeds to block 406 with the processor 105 (FIG. 1) executing program code of first module 210 to initiate the first algorithm and, responsive to receiving the inputs, building an unrolled netlist, with random initial values, for K cycles, where K is an integer number identified by the input parameter (NUM_CYCLES). According to one embodiment, K represents the number of cycles that needs to be analyzed for proof-based abstraction. The unrolled netlist is built without inlining register initial values. Instead, the algorithm1 inserts RANDOM gates to represent an unconstrained initial state.

With the building of the unrolled netlist completed, the method 400 includes running a satisfiability (SAT) solver on the unrolled netlist with no initial value constraint (block 408). With no initial value constraint defined, the random initial values can take all $2^N$ values, where N=is an integer defined above with reference to FIG. 3B. According to one aspect of the disclosure, this process of running the SAT solver with the initial value constraint is performed instead of adding the actual initial value constraints. The net result is that no initial value constraints are imposed during the running of the SAT solver. The method 400 makes a determination at decision block 412 whether the SAT solver indicates that the result is satisfiable. In response to the result not being satisfiable, the method performs an abstraction (block 414) and then returns the abstraction as the output to the CGBPA tool 125 (block 416).

However, in response to the SAT solver returning a SATISFIABLE result, the method includes analyzing the counterexample (CEX) and determining whether the CEX generated is valid in the original netlist (N1) (block 418). When the CEX is not valid on the original netlist, the CEX is a spurious CEX. In one embodiment, analyzing the CEX and determining whether the CEX is valid on the original netlist involves casting a SAT check over the original netlist, including the true initial values of the original netlist, to see if the target (T1) is still asserted, while adhering to the RANDOM gate valuations in the CEX. In response to the resulting CEX being valid, the method includes returning the CEX as an output to algorithm1 (block 420). In one embodiment, the determination completed at block 418 is performed by execution of a function "check_if_cex_is_valid_in_original_netlist( )". Also, if the CEX is valid, then the target (T1) that is being analyzed is assertable, and the resulting CEX as an output of the algorithm1. According to one aspect of the disclosure, the resulting CEX being spurious indicates that not enough initial value information was given to the SAT solver. Returning to the method, when the CEX is spurious, i.e., not valid, the method includes forwarding a set of input parameters to algorithm2 (block 422). The CEX is thus analyzed using algorithm 2 (which is described below) to determine the minimal initial value constraint that needs to be added to avoid the CEX. Once algorithm2 completes processing and returns a result to algorithm1, the method comprises modifying or setting the existing initial value constraint to include the additional constraints returned from algorithm 2 (block 424). Method 400 then moves to block 426 and the SAT solver is now re-run with the modified/updated initial value constraint. Method 400 then iterates back to block 412. According to one aspect of the disclosure, this re-running of the SAT solver is incrementally done so that the SAT solver maintains the old learned clauses, which enables faster SAT run times. The above method processes thus complete the functions of algorithm1, which is provided below. Algorithm1 provides a counter example guided proof-based abstraction (CGPBA) loop. Each separate line of pseudo-code and/or comments is referenced in numerical order by a leading reference number.

```
function do_proof_based_abstraction(Netlist N1, Target
    T1, unsigned num_cycles)
{
1. Netlist unrolled_T1_N1=build_unrolled_netlist_with_
    random_initial_values(N1, num_cycles);
2. Netlist initial_value_constraint=CONST_ONE;
3. result=run_sat_solver(unrolled_T1_N1, initial_value_
    constraint);
    // result will be either satisfiable or unsatisfiable. In the
        former case a CEX is generated
4. if(result==SATISFIABLE)
{
5.   valid=check_if_cex_is_valid_in_original_netlist(N1,
    T1, num_cycles, CEX);
    // CEX would be available for satisfiable results
6. if(valid==TRUE)
{
7. return CEX to user;
}
8. else if (valid==FALSE)
{// it is a spurious CEX
9. initial_value_constraint=refine_initial_value_
    constraint(N1,    CEX,    initial_value_constraint,
    unrolled_T1_N1);
10. goto 3;
    // re-run the SAT solver with the new initial value con-
        straint
}
}
11. else if(result==UNSATISFIABLE)
{// we were able to get a proof, now we can obtain the
    abstraction
12. return Abstraction to user: i.e. the unsatisfiable;
}
```

Algorithm 2, which is called during execution of algorithm1, describes how an initial value constraint is refined based on detection of a spurious CEX. In one embodiment, the goal of algorithm2 and algorithm3 is to minimize the number of assignments in spurious CEX. The pseudo code of algorithm2 is now presented, and is described in detail below with reference to the method presented by FIG. 5.

```
function refine_initial_value_constraint(Netlist N1, Coun-
    terexample CEX1, Netlist initial_value_constraint,
    Netlist unrolled_T1_N1)
{
1. while(true)
2.   new_result=run_sat_solver(unrolled_T1_N1, initial_
    value_constraint);
    // new_result must be SATISFIABLE. CEX2 refers to
        the resulting counterexample
3. if(set of all registers who have non-X cycle 0 value in
    CEX1 is greater than those in CEX2)
4. replace CEX1=CEX2
5. else break;
6. Counterexample min_CEX1=minimize_cex_with_sim
    (N1, CEX1);
    // Use ternary simulation to minimize the number of
        assignments in CEX1
7. Set R1=find_minimal_set_of_registers_in_conflict(N1,
    min_CEX1);
8. Netlist new_initial_value_constraint=build_initial_
    value_constraint_for_registers (R1);
9. return (initial_value_constraint AND new_initial_val-
    ue_constraint);
```

Figure 5:
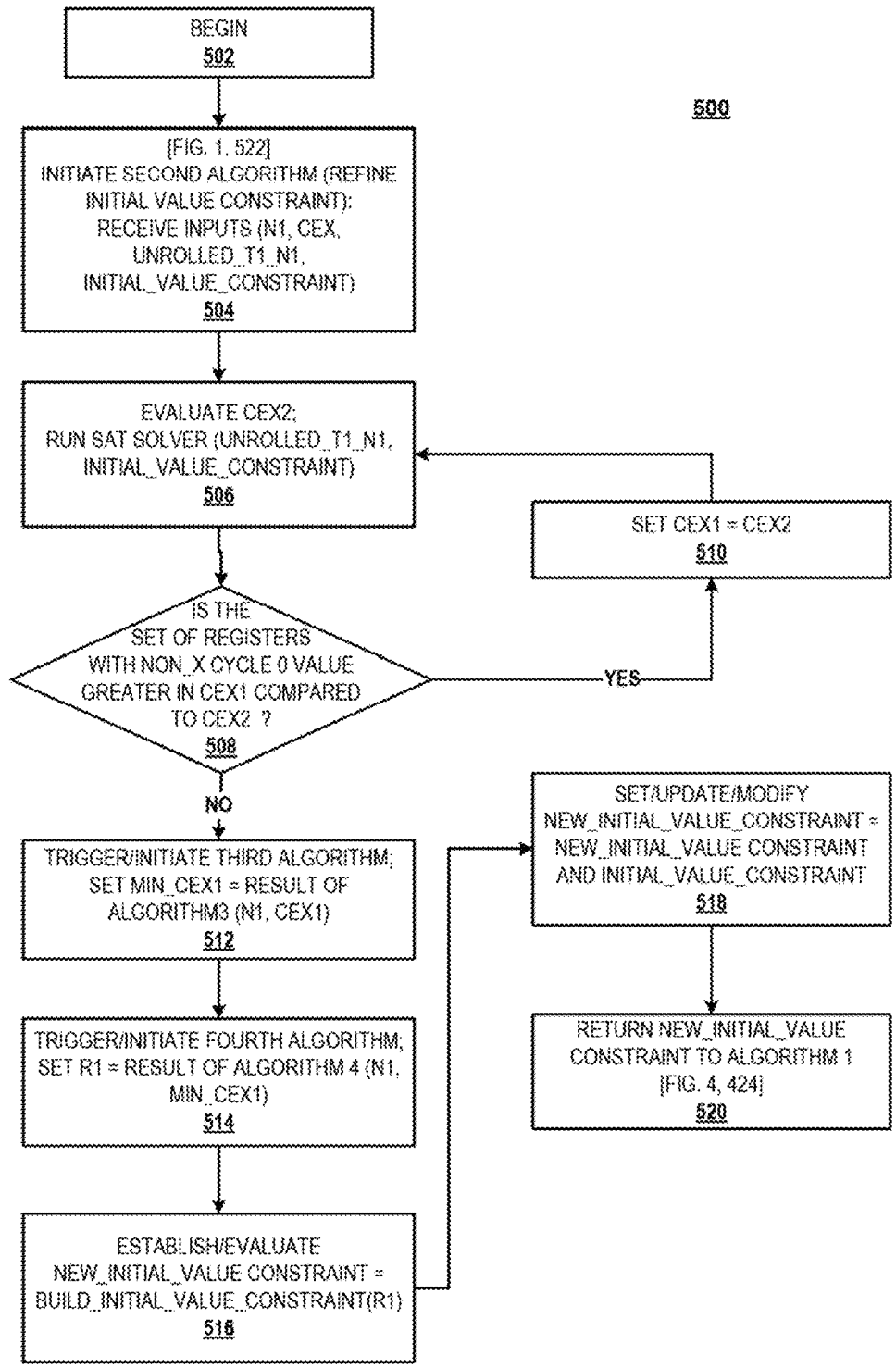
FIG. 5 is a flow chart illustrating a method for refining initial value constraints within the counterexample-guided proof-based abstraction method of FIG. 4, according to one embodiment.

The computer implemented method of FIG. 5 begins at block 502 and proceeds to block 504 at which algorithm2 is initialized by receive of inputs N1, CEX, the unrolled netlist, and the initial value constraint. The method then includes making repeated calls to the SAT solver, with a requirement that each call has to be satisfiable, in order to obtain a new counterexample for each call. Thus, as shown at block 506, the method includes evaluating a next CEX (CEX2) by running the SAT solver on the unrolled netlist, followed by a determination at block 508 whether the set of registers with non_X cycle 0 value (i.e., a 0 or 1 value) is greater in CEX1 compared to CEX2. In response to the number of registers with non_X values being greater in the earlier CEX, the method sets CEX2 as CEX1, i.e., replace the original CEX1 with the CEX2. Thus, if a subset of initial values is assigned in the resulting new CEX2 versus being assigned in the prior CEX1, these counterexamples are swapped. The aim of one aspect of the disclosure is to add as small a constraint as possible. That is, the aim is to define the constraint over a smaller number of registers. As described herein, the number of registers over which the constraint is defined is determined by the number of registers with non_X cycle 0 value. The method of FIG. 5 continues to iterate through the blocks 506-508-510 until the evaluation at block 508 yields a negative response. Thus, in response to the number of registers in the set of registers with non_X cycle0 value being less in a current CEX1 than a newly determined CEX2, the method proceeds to block 512 at which algorithm3 is triggered or initiated by forwarding N1 and CEX1 as input parameters to third module 230 (FIG. 2). Also, at block 512, the method sets the result received from algorithm3 as the new minimum CEX1 (MIN_CEX1). As described below with reference to algorithm3 and FIG. 6, determination of the result utilized as MIN_CEX1 involves using ternary simulation.

Figure 6:
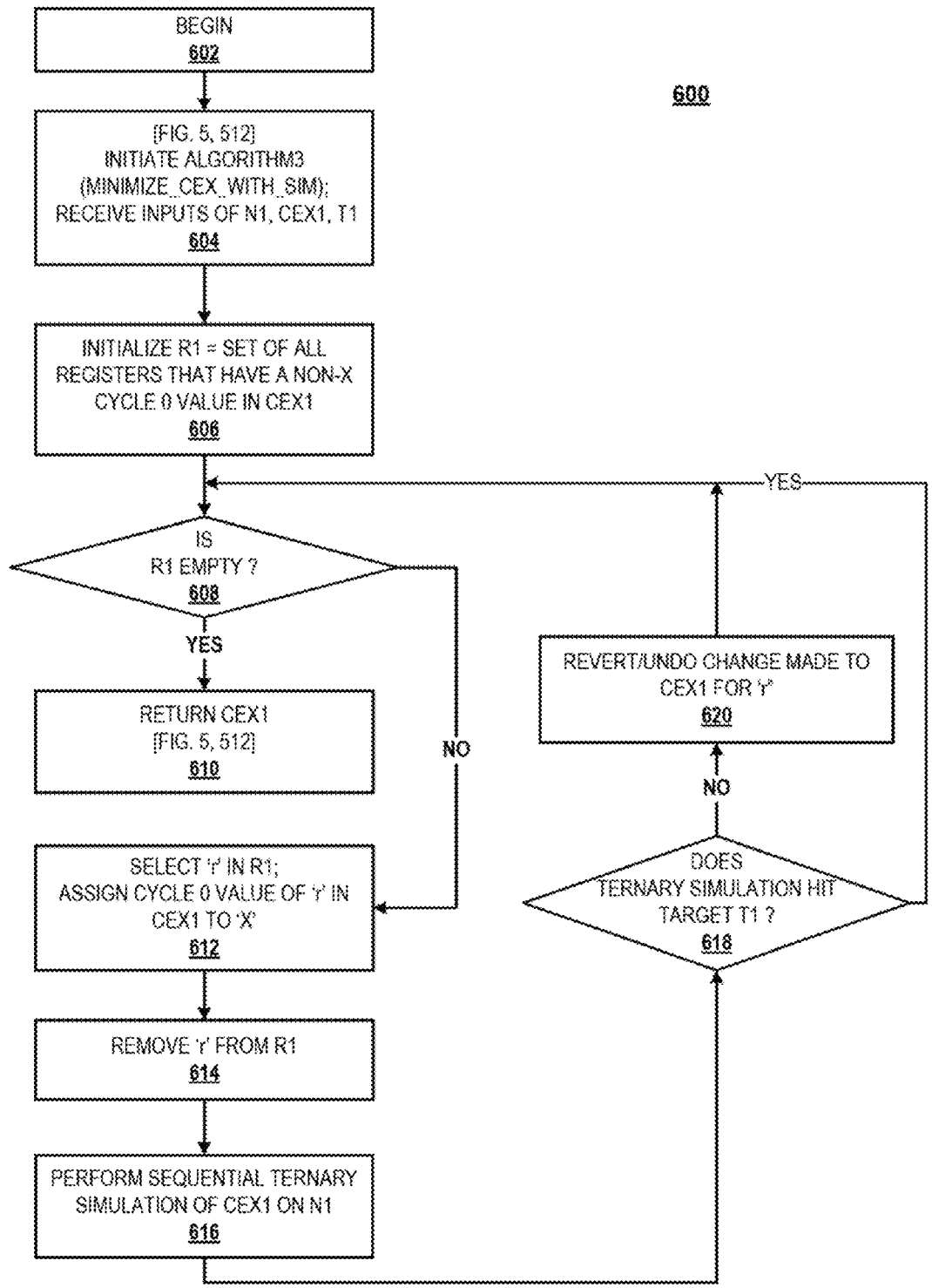
FIG. 6 is a flow chart illustrating a method for minimizing counterexamples with ternary simulation while performing the refining of initial value constraints of FIG. 5, according to one embodiment.

According to one aspect of the disclosure, a two-phase approach is utilized because each SAT call may efficiently eliminate many initial value constraints, given the heuristic nature of the SAT solvers being capable of yielding various different solutions. In contrast, a minimize_cex_with_sim function is more exhaustive in precisely attempting to eliminate each assigned initial value and determining if the result still yields a spurious failure. The cost of this precision is in runtime. That is, if there are 1000s of registers in the netlist, this process can entail 1000s of simulation steps because the method has to complete a ternary simulation for each register in R1. Thus, when the set R1 is large, the number of simulations is also large. FIG. 6 illustrates the processor implemented method by which the third algorithm, presented below, can be completed, according to one embodiment. Algorithm3 provides a method for ternary simulation based minimization of initial value constraints, as is as follows.

```
function minimize_cex_with_sim(Netlist N1, Counterex-
    ample CEX1)
{
1. Set R1=set of all registers who have non-X cycle 0 value
    in CEX1
2. for each register r in R1
3. replace the non-X cycle 0 value with X in CEX1
4. perform sequential ternary simulation of CEX1 on
    Netlist N1
5. If target t1 is not hit during ternary simulation, revert the
    non-X to X for register r
6. end for each;
}
```

Algorithm3 provides one possible method 600 to minimize the number of necessary register initial value assignments in a counterexample, according to one embodiment. For each register whose initial value is a "0" or "1", a ternary simulation is performed where the initial value is replaced with a "X" value. If the "X" does not propagate to the target (i.e., the target is still driven to a "1" by the simulation), then the initial value assignment of that particular register is irrelevant to the counterexample. If the target is no longer driven to "1", then the initial value is restored to its previous value. Algorithm3 is initiated in response to receiving inputs of N1, CEX1, and T1 from algorithm2 (block 604). Then, method 600 includes initializing R1 to be equal to a set of all registers that have a non_X cycle 0 value in CEX1 (block 606). Method 600 determines at decision block 608 whether R1 is empty. If R1 is empty, method 600 returns CEX1 to algorithm 2 (block 610). However, in response to R1 not being empty, method 600 selects a register (r) in R1 and assigns a cycle 0 value of r in CEX1 to X (block 612). Then, method 600 removes the register r from R1 (block 614). Method performs a sequential ternary simulation of CEX1 on N1 (block 616), and determines at block 618 whether the ternary simulation hits the target T1. In response to the ternary simulation hitting the target, method 600 undoes the change made to CEX1 for register r (block 620) and processing of method 600 returns to block 608. Also, in response to the ternary simulation not hitting the target, method 600 returns to block 608.

As described above, Algorithm2 initially attempts to minimize the counterexample using SAT solving to perform large reductions in the size of set R1 that is analyzed in Algorithm 3. Thus, the cumulative simulation resources are substantially reduced. Once the CEX is minimized utilizing the above method of algorithm3, the method 200 calls Algorithm 4 (described below) to determine the minimal set of registers whose initial value constraints needs to be added to avoid a spurious CEX. According to one aspect of the disclosure, the performance of this algorithm4 is necessary for optimality because even though some initial values may be relevant to the minimized counterexample, the initial values may already be consistent with the initial states of the netlist. Thus, adding these initial values as constraints would not serves a useful purpose in the analyses provided herein. Also, aspects of the disclosure involve building a constraint over the set of registers that reflects the adequate new initial values and conjoin the constraint with the present initial value constraint at the end of Algorithm 2.

Figure 7:
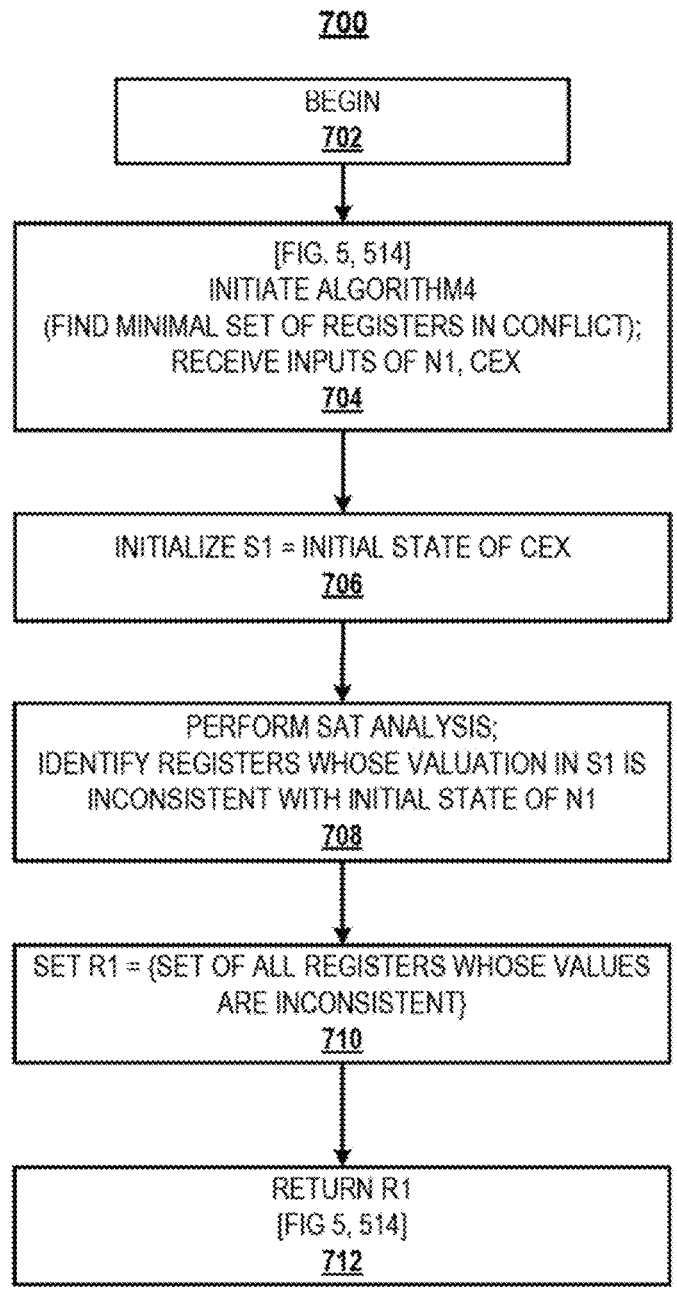
FIG. 7 is a flow chart illustrating a method for finding a minimal set of registers in conflict while performing the refining of initial value constraints of FIG. 5, according to one embodiment.

Referring now to FIG. 7, there is presented a method, called by Algorithm2, for performing minimization of spurious-counterexample initial value constraints by utilizing comparisons to true initial values. The method 700 generally represents the below algorithm4.

function find_minimal_set_of_registers_in_conflict (Netlist N1, Counterexample CEX)
{
1. State S1=initial_state_of_CEX1;
2. Perform SAT analysis to identify register valuations in S1 that are inconsistent with the initial value of Netlist N1
3. Return the set of registers whose register valuations could not be satisfied
}

Algorithm 4 describes one possible method to identify a set of registers for which the given counterexample has values inconsistent with the real initial value functions of the registers. Method 700 begins at block 702 and proceeds to block 704 at which fourth module 240 (FIG. 2) receives inputs of N1 and CEX to initiate processing of algorithm4. Method 700 proceeds by initializing S1 to be equal to the initial state of CEX (block 706). Method 700 then includes performing a SAT analysis and indentifying registers whose valuation in S1 is inconsistent with the initial state of N1 (block 708). A SAT instance is cast over the initial value functions and attempts to justify the initial state valuation S1. The result of the SAT run will be UNSATISFIABLE, as otherwise the counterexample was not spurious. The unsatisfiable core of the resulting SAT solver is then analyzed to identify a minimal subset of registers responsible for the conflict, which is generally smaller than the subset of the previously-minimized trace. Thus, at block 710, method 700 sets R1 to be equal to the set of all registers whose values are inconsistent. Then, method 700 returns R1 to the algorithm2 (block 712). As an example of performing method 700 of algorithm 4, assume that candidate netlist N1 has three registers R1, R2, and R3, and State S1 comprises the values of {R1=0, R2=1, R3=1}, and initial state is {R1=0, R2=1, R3=0}, then the method 700 will return {R3}.

Returning now to the description of FIG. 5, and the method 500 of algorithm 2. Beginning at block 514, once the fourth algorithm returns a result, that result is set as R1 in algorithm 2 (block 514). Then, method 500 initiates a function to build an initial value constraint utilizing the R1 as the input set of registers, and establishes the result of that build process as a new initial value constraint (block 516). Method 500 then updates and/or sets the new initial value constraint to be equal to the new initial value constraint plus (AND) the original initial value constraint (block 518). Finally, method 500 returns the new initial value constraint (i.e., the sum of the two sets of R1s from block 518) to algorithm1 (block 520).

The above sequence of inter-related algorithms, when applied to several example tests cases, yields a couple of data points that illustrate the usefulness of the CGPBA tool 125 in terms of evaluating RANDOM gates (variables), 2-input AND gates (Ands), and Registers. As a first example, a netlist is evaluated having the following set of values before Abstraction: Variables=3397, Ands=272478, Registers=14297. When Proof-Based Abstraction is applied without the techniques presented by CGPBA tools 125, the results include: Variables=105, Ands=11791, and Registers=1167. However, when CGPBA tools 125 are utilized to provide proof-based abstraction, the results are as follows: Variables: 56, Ands=732, and Registers: 122. A second test case, run on a netlist with Variables=8, Ands=18659, and Registers=2205 before abstraction, yielded the following comparative results: (a) with non-CGPBA tools 125 proof-based abstraction: Variables=436, Ands=8235, and Registers=950; and (b) with proof-based abstraction provided by CGPBA tools 125: Variables: 286, Ands=3028, and Registers: 274.

Implementation of the above proof-based abstraction utilizing CGPBA tools 125 provides a faster SAT analysis since fewer initial value constraints are present in the SAT analysis. Also, having a smaller number of initial value constraints yields smaller abstractions since the SAT solver will not be burdened by reasoning about the irrelevant initial values. This reduction in the amount work required to be completed by the SAT solver is particularly valuable, since in one or more embodiments, after the abstraction process, a heavier-weight proof algorithm is used on the resulting sequential abstraction netlist. Additionally, eliminating unnecessary initial value constraints improves the value of the SAT counterexamples in refining the netlist toward an adequate abstraction rather than having to refine many less-relevant counterexamples, constrained by initial values. That is, implementation of one or more aspects of the disclosure can result in fewer refinements across unfolding depths which add state elements, versus merely initial-value constraints thereof. In contrast, traditional abstraction is likely to perform one "small" refinement for time "I" given the impact of initial values to the target at that unfolding depth, then perform another small refinement at time "i+1" because the initial values impact the targets slightly differently at that time. The processing performed by CGPBA tools 125 yields one more significant refinement that covers both time frames. When this benefit is coupled with the fact that refinement of state elements is heuristic, i.e., sometimes irrelevant registers are added, the method implemented by CGPBA tool 125, which requires less refinements, improves the quality and size of the final abstraction.

In each of the flow charts above, one or more of the methods may be embodied in a computer readable medium containing computer readable code such that a series of functions are performed when the computer readable code is executed on a computing device. In some implementations, certain steps of the methods are combined, performed simultaneously or in a different order, or perhaps omitted, without deviating from the spirit and scope of the disclosure. Thus, while the method steps are described and illustrated in a particular sequence, use of a specific sequence of steps is not meant to imply any limitations on the disclosure. Changes may be made with regards to the sequence of steps without departing from the spirit or scope of the present disclosure. Use of a particular sequence is therefore, not to be taken in a limiting sense, and the scope of the present disclosure is defined only by the appended claims.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, R.F, etc., or any suitable combination of the foregoing. Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As will be further appreciated, the processes in embodiments of the present disclosure may be implemented using any combination of software, firmware or hardware. As a preparatory step to practicing the disclosure in software, the programming code (whether software or firmware) will typically be stored in one or more machine readable storage mediums such as fixed (hard) drives, diskettes, optical disks, magnetic tape, semiconductor memories such as ROMs, PROMs, etc., thereby making an article of manufacture in accordance with the disclosure. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the disclosure may be practiced by combining one or more machine-readable storage devices containing the code according to the present disclosure with appropriate processing hardware to execute the code contained therein. An apparatus for practicing the disclosure could be one or more processing devices and storage systems containing or having network access to program(s) coded in accordance with the disclosure.

Thus, it is important that while an illustrative embodiment of the present disclosure is described in the context of a fully functional computer (server) system with installed (or executed) software, those skilled in the art will appreciate that the software aspects of an illustrative embodiment of the present disclosure are capable of being distributed as a program product in a variety of forms, and that an illustrative embodiment of the present disclosure applies equally regardless of the particular type of media used to actually carry out the distribution.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A computer-implemented method for performing proof-based abstraction via a computing device, the method comprising:
   receiving an input containing a candidate netlist (N1), a target (T1), and a number, K, of cycles of interest, wherein K is an integer number that represents a number of cycles that are required to be analyzed for the proof-based abstraction;
   in response to receiving the inputs, building, by a processor of the computing device, an inductively unrolled netlist, utilizing random, symbolic initial values, for K cycles;
   providing the unrolled netlist with a first initial value constraint to a satisfiability (SAT) solver where the first initial value constraint is empty;
   receiving a result of the SAT solver;
   determining whether the result of the SAT solver is satisfiable;
   in response to the result of the SAT solver not being satisfiable, performing an abstraction on the netlist and outputting the abstraction; and
   in response to the result of the SAT solver being satisfiable, performing one of: (a) outputting a valid counterexample of the original netlist; and (b) lazily adding initial value constraints to avoid spurious counterexamples.

2. The computer-implemented method of claim 1, wherein outputting a valid counter example comprises:
   analyzing a resulting counterexample (CEX) and determining whether the resulting CEX generated is a valid CEX of the original netlist (N1);
   in response to determining that the resulting CEX is valid, outputting the CEX; and
   in response to the CEX not being a valid CEX of the original netlist, analyzing the resulting CEX and determining a minimal initial value constraint that needs to be added to the unrolled netlist to avoid the resulting CEX.

3. The computer-implemented method of claim 2, further comprising:
   generating updated initial value constraints by adding minimal initial value constraints to a previous initial value constraint;
   re-running the SAT solver with the updated initial value constraints; and
   incrementally re-running the SAT solver with a next updated initial value constraints until a resulting CEX is valid on the original netlist, wherein incrementally re-running the SAT solver enables the SAT solver to maintain one or more previously learned clauses and enables faster SAT solver run times.

4. The computer-implemented method of claim 2, wherein analyzing the resulting CEX comprises:
   forwarding a set of input parameters to a subroutine to perform the analyzing of the CEX; and
   receiving from the subroutine a result indicating which initial value constraints are required to be added to avoid the resulting CEX from being a spurious CEX, wherein the resulting CEX is a spurious CEX that is not valid on the original netlist when not enough initial value information was given to the SAT solver.

5. The computer-implemented method of claim 2, wherein:
   the unrolled netlist is built without inlining register initial values, and building the unrolled netlist comprises inserting RANDOM gates to represent an unconstrained initial state; and
   analyzing the resulting CEX and determining whether the resulting CEX is valid on the original netlist comprises:
   imposing true initial values of the original netlist during a run of the SAT solver; and determining if the target is still asserted, while adhering to the RANDOM gate valuations in the CEX.

6. The computer-implemented method of claim 2, wherein lazily adding initial value constraints to avoid spurious counterexamples comprises:
minimizing a number of necessary register initial value assignments in a counterexample by performing a ternary simulation iteratively utilizing an unassigned value of X for each register whose initial value is one of a "0" and a "1";
determining if propagating an assigned X value for a particular register through the unrolled netlist drives the target to a 1 value;
in response to the propagation of the X value still driving the target to a 1 value, tagging an initial value assignment of that particular register as irrelevant to the counterexample;
in response to the propagation of the X value not driving the target to the 1 value, restoring the particular register to its the initial value.

7. The computer-implemented method of claim 6, further comprising:
initializing a set R1 to be equal to a set of all registers that have a non_X cycle 0 value in the resulting CEX;
determining whether R1 is empty;
in response to R1 being empty, returning the resulting CEX as a valid counterexample;
in response to R1 not being empty, selecting a first register (r) in R1 and assigning a cycle 0 value of the register r in the resulting counterexample to X;
removing the selected register from R1;
performing a sequential ternary simulation of the registers of the resulting CEX on the netlist and determining whether one or more of the ternary simulation results in an assertion of the target;
in response to the ternary simulation of a first register asserting the target, undoing a change made to the first register of the resulting CEX; and
iterating the ternary simulation for a next register in R1.

8. The computer-implemented method of claim 7, further comprising:
determining a minimal set of registers whose initial value constraints need to be added to avoid a spurious CEX;
initializing a set S1 to be equal to the initial state of the resulting CEX;
performing a SAT analysis and identifying registers whose valuation in S1 is inconsistent with the initial state of the netlist;
analyzing an unsatisfiable core of a resulting SAT solver to identify a minimal subset of registers responsible for a conflict, wherein the minimal subset is smaller than a subset of a previously-minimized trace; and
setting R1 to be equal to the set of all registers whose values are inconsistent.

9. The computer-implemented method of claim 1, further comprising:
building new initial value constraints utilizing R1 as an input set of registers;
generating combined initial value constraints by combining the new initial value constraints with a previous set of initial value constraints; and
generating one of an abstraction and a new CEX as a result from the SAT solver utilizing the combined initial value constraints.

10. A computing device for performing proof-based abstraction, the computing device comprising a processor, an input device, an output device, and a memory with program code that is executed by the processor to cause the computing device to:
receive an input containing a candidate netlist (N1), a target (T1), and a number, K, of cycles of interest, wherein K is an integer number that represents a number of cycles that are required to be analyzed for the proof-based abstraction;
in response to receiving the inputs, build an inductively unrolled netlist, utilizing random, symbolic initial values, for K cycles;
provide the unrolled netlist with a first initial value constraint to a satisfiability (SAT) solver where the first initial value constraint is empty;
receive a result of the SAT solver;
determine whether the result of the SAT solver is satisfiable;
in response to the result of the SAT solver not being satisfiable, perform an abstraction on the netlist and outputting the abstraction; and
in response to the result of the SAT solver being satisfiable, perform one of: (a) outputting a valid counterexample of the original netlist; and (b) lazily adding initial value constraints to avoid spurious counterexamples.

11. The computing device of claim 10, wherein the program code that causes the computing device to output a valid counter example further causes the computing device to:
analyze a resulting counterexample (CEX) and determine whether the resulting CEX generated is a valid CEX of the original netlist (N1);
in response to determining that the resulting CEX is valid, output the CEX; and
in response to the CEX not being a valid CEX of the original netlist:
analyze the resulting CEX and determining a minimal initial value constraint that needs to be added to the unrolled netlist to avoid the resulting CEX;
generating updated initial value constraints by adding minimal initial value constraints to a previous initial value constraint;
re-running the SAT solver with the updated initial value constraints; and
incrementally re-running the SAT solver with a next updated initial value constraints until a resulting CEX is valid on the original netlist, wherein incrementally re-running the SAT solver enables the SAT solver to maintain one or more previously learned clauses and enables faster SAT solver run times.

12. The computing device of claim 11, wherein the program code that causes the computing device to analyze the resulting CEX comprises program code that causes the computing device to:
forward a set of input parameters to a subroutine to perform the analyzing of the CEX, wherein the unrolled netlist is built without inlining register initial values, and building the unrolled netlist comprises inserting RANDOM gates to represent an unconstrained initial state;
analyze the resulting CEX and determine whether the resulting CEX is valid on the original netlist by: imposing true initial values of the original netlist during a run of the SAT solver; and determining if the target is still asserted, while adhering to the RANDOM gate valuations in the CEX; and
receive from the subroutine a result indicating which initial value constraints are required to be added to avoid the resulting CEX from being a spurious CEX, wherein the resulting CEX is a spurious CEX that is not valid on the original netlist when not enough initial value information was given to the SAT solver.

13. The computing device of claim 11, wherein the program code for lazily adding initial value constraints to avoid spurious counterexamples comprises program code that causes the computing device to:
   minimize a number of necessary register initial value assignments in a counterexample by performing a ternary simulation iteratively utilizing an unassigned value of X for each register whose initial value is one of a "0" and a "1";
   determine if propagating an assigned X value for a particular register through the unrolled netlist drives the target to a 1 value;
   in response to the propagation of the X value still driving the target to a 1 value, tag an initial value assignment of that particular register as irrelevant to the counterexample; and
   in response to the propagation of the X value not driving the target to the 1 value, restore the particular register to its the initial value.

14. The computing device of claim 11, wherein the program code further comprises program code that causes the computing device to:
   initialize a set R1 to be equal to a set of all registers that have a non_X cycle 0 value in the resulting CEX;
   determine whether R1 is empty;
   in response to R1 being empty, return the resulting CEX as a valid counterexample;
   in response to R1 not being empty, select a first register (r) in R1 and assigning a cycle 0 value of the register r in the resulting counterexample to X;
   remove the selected register from R1;
   perform a sequential ternary simulation of the registers of the resulting CEX on the netlist and determine whether one or more of the ternary simulation results in an assertion of the target;
   in response to the ternary simulation of a first register asserting the target, undo a change made to the first register of the resulting CEX; and
   iterate the ternary simulation for a next register in R1.

15. The computing device of claim 14, wherein the program code further comprises code that causes the computing device to:
   determine a minimal set of registers whose initial value constraints need to be added to avoid a spurious CEX;
   initialize a set S1 to be equal to the initial state of the resulting CEX;
   perform a SAT analysis and identifying registers whose valuation in S1 is inconsistent with the initial state of the netlist;
   analyze an unsatisfiable core of a resulting SAT solver to identify a minimal subset of registers responsible for a conflict, wherein the minimal subset is smaller than a subset of a previously-minimized trace; and
   set R1 to be equal to the set of all registers whose values are inconsistent.

16. The computing device of claim 10, wherein the program code further comprises code that causes the computing device to:
   build new initial value constraints utilizing R1 as an input set of registers;
   generate combined initial value constraints by combining the new initial value constraints with a previous set of initial value constraints; and
   generate one of an abstraction and a new CEX as a result from the SAT solver utilizing the combined initial value constraints.

17. A computer program product for performing proof-based abstraction, the computer program product comprising:
   a computer readable device; and
   program code on the computer readable device, which program code is configured to be executed by a processor within a computing device to cause the computing device to:
      receive an input containing a candidate netlist (N1), a target (T1), and a number, K, of cycles of interest, wherein K is an integer number that represents a number of cycles that are required to be analyzed for the proof-based abstraction;
      in response to receiving the inputs, build an inductively unrolled netlist, utilizing random, symbolic initial values, for K cycles;
      provide the unrolled netlist with a first initial value constraint to a satisfiability (SAT) solver where the first initial value constraint is empty;
      receive a result of the SAT solver;
      determine whether the result of the SAT solver is satisfiable;
      in response to the result of the SAT solver not being satisfiable, perform an abstraction on the netlist and outputting the abstraction; and
      in response to the result of the SAT solver being satisfiable, perform one of: (a) outputting a valid counterexample of the original netlist; and (b) lazily adding initial value constraints to avoid spurious counterexamples.

18. The computer program product of claim 17, wherein the program code that causes the computing device to output a valid counter example further includes code that causes the computing device to:
   analyze a resulting counterexample (CEX) and determine whether the resulting CEX generated is a valid CEX of the original netlist (N1);
   in response to determining that the resulting CEX is valid, output the CEX; and
   in response to the CEX not being a valid CEX of the original netlist:
      analyze the resulting CEX and determining a minimal initial value constraint that needs to be added to the unrolled netlist to avoid the resulting CEX;
      generating updated initial value constraints by adding minimal initial value constraints to a previous initial value constraint;
      re-running the SAT solver with the updated initial value constraints; and
      incrementally re-running the SAT solver with a next updated initial value constraints until a resulting CEX is valid on the original netlist, wherein incrementally re-running the SAT solver enables the SAT solver to maintain one or more previously learned clauses and enables faster SAT solver run times.

19. The computer program product of claim 18, wherein the program code that causes the computing device to analyze the resulting CEX comprises program code that causes the computing device to:
   forward a set of input parameters to a subroutine to perform the analyzing of the CEX, wherein the unrolled netlist is built without inlining register initial values, and building the unrolled netlist comprises inserting RANDOM gates to represent an unconstrained initial state;

analyze the resulting CEX and determine whether the resulting CEX is valid on the original netlist by: imposing true initial values of the original netlist during a run of the SAT solver; and determining if the target is still asserted, while adhering to the RANDOM gate valuations in the CEX; and receive from the subroutine a result indicating which initial value constraints are required to be added to avoid the resulting CEX from being a spurious CEX, wherein the resulting CEX is a spurious CEX that is not valid on the original netlist when not enough initial value information was given to the SAT solver.

20. The computer program product of claim 18, wherein the program code for lazily adding initial value constraints to avoid spurious counterexamples comprises program code that causes the computing device to:

minimize a number of necessary register initial value assignments in a counterexample by performing a ternary simulation iteratively utilizing an unassigned value of X for each register whose initial value is one of a "0" and a "1";

determine if propagating an assigned X value for a particular register through the unrolled netlist drives the target to a 1 value;

in response to the propagation of the X value still driving the target to a 1 value, tag an initial value assignment of that particular register as irrelevant to the counterexample; and in response to the propagation of the X value not driving the target to the 1 value, restore the particular register to its the initial value.

21. The computer program product of claim 18, wherein the program code that causes the computing device to analyze the resulting CEX comprises program code that causes the computing device to:

initialize a set R1 to be equal to a set of all registers that have a non_X cycle 0 value in the resulting CEX;

determine whether R1 is empty;

in response to R1 being empty, return the resulting CEX as a valid counterexample;

in response to R1 not being empty, select a first register (r) in R1 and assigning a cycle 0 value of the register r in the resulting counterexample to X;

remove the selected register from R1;

perform a sequential ternary simulation of the registers of the resulting CEX on the netlist and determine whether one or more of the ternary simulation results in an assertion of the target;

in response to the ternary simulation of a first register asserting the target, undo a change made to the first register of the resulting CEX; and iterate the ternary simulation for a next register in R1.

22. The computer program product of claim 21, wherein the program code further comprises code that causes the computing device to:

determine a minimal set of registers whose initial value constraints need to be added to avoid a spurious CEX;

initialize a set S1 to be equal to the initial state of the resulting CEX;

perform a SAT analysis and identifying registers whose valuation in S1 is inconsistent with the initial state of the netlist;

analyze an unsatisfiable core of a resulting SAT solver to identify a minimal subset of registers responsible for a conflict, wherein the minimal subset is smaller than a subset of a previously-minimized trace; and set R1 to be equal to the set of all registers whose values are inconsistent.

23. The computer program product of claim 17, wherein the program code further comprises code that causes the computing device to:

build new initial value constraints utilizing R1 as an input set of registers;

generate combined initial value constraints by combining the new initial value constraints with a previous set of initial value constraints; and generate one of an abstraction and a new CEX as a result from the SAT solver utilizing the combined initial value constraints.

* * * * *